United States Patent
Liu et al.

(10) Patent No.: US 10,699,958 B2
(45) Date of Patent: Jun. 30, 2020

(54) SEMICONDUCTOR DEVICE WITH HIGH-RESISTANCE GATE

(71) Applicant: United Microelectronics Corp., Hsinchu (TW)

(72) Inventors: Wei-Chang Liu, Singapore (SG); Zhen Chen, Singapore (SG); Shen-De Wang, Hsinchu County (TW); Wang Xiang, Singapore (SG); Wei Ta, Singapore (SG); Ling-Gang Fang, Singapore (SG); Shang Xue, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/116,730

(22) Filed: Aug. 29, 2018

(65) Prior Publication Data

US 2020/0043791 A1    Feb. 6, 2020

(30) Foreign Application Priority Data

Aug. 3, 2018   (CN) ............................ 2018 1 0876005

(51) Int. Cl.
*H01L 21/8234* (2006.01)
*H01L 29/66* (2006.01)
(Continued)

(52) U.S. Cl.
CPC ............. *H01L 21/823456* (2013.01); *H01L 21/82345* (2013.01); *H01L 21/82385* (2013.01); *H01L 21/823443* (2013.01); *H01L 21/823468* (2013.01); *H01L 21/823835* (2013.01); *H01L 21/823864* (2013.01); *H01L 27/088* (2013.01); *H01L 27/0922* (2013.01); *H01L 29/42376* (2013.01); *H01L 29/6653* (2013.01); *H01L 29/6656* (2013.01); *H01L 29/66484* (2013.01); *H01L 29/7831* (2013.01);
(Continued)

(58) Field of Classification Search
None
See application file for complete search history.

(56) References Cited

U.S. PATENT DOCUMENTS 6,355,524 B1 *   3/2002  Tuan ................. H01L 21/31053
                                                        257/E21.244
6,642,586 B2 *  11/2003  Takahashi ............ H01L 27/115
                                                              257/390

(Continued)

*Primary Examiner* — Andres Munoz
(74) *Attorney, Agent, or Firm* — J.C. Patents

(57) ABSTRACT

A semiconductor device and a manufacturing method thereof are provided. The semiconductor device includes a first gate, a gate dielectric layer, a pair of second gates, a first spacer, and a second spacer. The first gate is disposed on a substrate. The gate dielectric layer is disposed between the first gate and the substrate. The pair of second gates are disposed on the substrate and respectively located at two sides of the first gate, wherein top surfaces of the pair of second gates are higher than a top surface of the first gate. The first spacer is disposed on sidewalls of the pair of second gates protruding from the top surface of the first gate and covers the top surface of the first gate. The second spacer is disposed between the gate dielectric layer and the pair of second gates, between the first gate and the pair of second gates, and between the first spacer and the pair of second gates.

20 Claims, 3 Drawing Sheets

(51) Int. Cl.
  *H01L 27/088*   (2006.01)
  *H01L 21/8238*  (2006.01)
  *H01L 27/092*   (2006.01)
  *H01L 29/423*   (2006.01)
  *H01L 29/78*    (2006.01)
  *H01L 21/8239*  (2006.01)

(52) U.S. Cl.
  CPC ...... *H01L 21/8239* (2013.01); *H01L 29/4234* (2013.01); *H01L 29/42356* (2013.01)

(56) References Cited

U.S. PATENT DOCUMENTS

| | | | |
|---|---|---|---|
| 6,984,558 B2* | 1/2006 | Slotboom | H01L 27/11521 |
| | | | 438/257 |
| 7,473,961 B2* | 1/2009 | Kim | H01L 29/66833 |
| | | | 257/321 |
| 8,546,866 B2* | 10/2013 | Nagai | H01L 29/42344 |
| | | | 257/316 |
| 2003/0143792 A1* | 7/2003 | Satoh | H01L 27/105 |
| | | | 438/197 |
| 2009/0090962 A1* | 4/2009 | Kikuchi | H01L 27/11568 |
| | | | 257/324 |
| 2010/0200909 A1 | 8/2010 | Kawashima et al. | |
| 2014/0242767 A1 | 8/2014 | Nishikizawa et al. | |
| 2016/0043098 A1 | 2/2016 | Nakanishi et al. | |

* cited by examiner

SEMICONDUCTOR DEVICE WITH HIGH-RESISTANCE GATE

CROSS-REFERENCE TO RELATED APPLICATION

This application claims the priority benefit of China application serial no. 201810876005.9, filed on Aug. 3, 2018. The entirety of the above-mentioned patent application is hereby incorporated by reference herein and made a part of this specification.

BACKGROUND OF THE INVENTION

Field of the Invention

The invention is related to a semiconductor device and a manufacturing method thereof, and more particularly, to a semiconductor device for which a silicide layer is not provided on a top surface of a gate having a high resistance value and a manufacturing method thereof.

Description of Related Art

In a common semiconductor device (such as a metal-oxide-semiconductor (MOS) transistor), to increase the processing efficiency of the device, a silicide layer is generally formed on the surface of a conductive region (such as a gate, source, drain, etc.) to reduce the resistance value of the region.

However, for a device requiring a high resistance value, to avoid the forming of a silicide layer on the surface of the device during a silicide process of other device, additional process steps are generally performed to form a protective layer on the surface of the device. As a result, process steps are complex and are not readily integrated with common processes.

SUMMARY OF THE INVENTION

The invention provides a semiconductor device, wherein a silicide layer is not provided on a top surface of a gate having a high resistance value.

The invention provides a manufacturing method of a semiconductor device to manufacture the semiconductor device above.

The semiconductor device of the invention includes a first gate, a gate dielectric layer, a pair of second gates, a first spacer, and a second spacer. The first gate is disposed on a substrate. The gate dielectric layer is disposed between the first gate and the substrate. The pair of second gates are disposed on the substrate and respectively located at two sides of the first gate, wherein top surfaces of the pair of second gates are higher than a top surface of the first gate. The first spacer is disposed on sidewalls of the pair of second gates protruding from the top surface of the first gate and covers the top surface of the first gate. The second spacer is disposed between the gate dielectric layer and the pair of second gates, between the first gate and the pair of second gates, and between the first spacer and the pair of second gates.

In an embodiment of the semiconductor device of the invention, a third spacer is further included and is disposed on sidewalls of the pair of second gates away from the first gate.

In an embodiment of the semiconductor device of the invention, a material of the third spacer and a material of the first spacer are, for instance, the same.

In an embodiment of the semiconductor device of the invention, a silicide layer is further included and disposed on the top surfaces of the pair of second gates.

In an embodiment of the semiconductor device of the invention, the top surfaces of the pair of second gates is, for instance, lower than a top surface of the second spacer, and the semiconductor device further includes a fourth spacer disposed on the top surfaces of the pair of second gates and located on the second spacer, and the silicide layer is located on the exposed top surfaces of the pair of second gates.

In an embodiment of the semiconductor device of the invention, a material of the third spacer, a material of the fourth spacer, and a material of the first spacer are, for instance, the same.

In an embodiment of the semiconductor device of the invention, a material of the first spacer is, for instance, a nitride.

In an embodiment of the semiconductor device of the invention, a material of the second spacer is, for instance, an oxide.

In an embodiment of the semiconductor device of the invention, a ratio of a height of the sidewalls of the pair of second gates protruding from the top surface of the first gate to a width of the first gate is, for instance, greater than 2.

The manufacturing method of the semiconductor device of the invention includes the following steps. A gate structure is formed on a substrate, wherein the gate structure includes a gate dielectric layer located on the substrate, a first gate located on the gate dielectric layer, and a hard mask layer located on the first gate. A first spacer is formed on sidewalls of the gate structure. A second gate is respectively formed on the first spacer at two sides of the gate structure, wherein top surfaces of the second gate is higher than a top surface of the first gate. The hard mask layer is removed. A second spacer is formed on sidewalls of the first spacer protruding from the top surface of the first gate and on sidewalls of the second gate, wherein the second spacer covers the top surface of the first gate.

In an embodiment of the manufacturing method of the semiconductor device of the invention, the forming method of the gate structure includes the following. A gate dielectric material layer, a gate material layer, and a hard mask material layer are formed on the substrate in order. A patterning process is performed to remove a portion of the gate dielectric layer, a portion of the gate material layer, and a portion of the hard mask material layer.

In an embodiment of the manufacturing method of the semiconductor device of the invention, a forming method of the first spacer includes the following. A spacer material layer is conformally formed on the substrate. An anisotropic etching process is performed to remove a portion of the spacer material layer and keep the spacer material layer located on the sidewalls of the gate structure.

In an embodiment of the manufacturing method of the semiconductor device of the invention, the forming method of the second spacer includes the following. A gate material layer is conformally formed on the substrate. An anisotropic etching process is performed to remove a portion of the gate material layer and keep the gate material layer located on the sidewalls of the gate structure.

In an embodiment of the manufacturing method of the semiconductor device of the invention, after the anisotropic etching process is performed, a top surface of the gate material layer located on the sidewalls of the gate structure is, for instance, lower than a top surface of the hard mask layer.

In an embodiment of the manufacturing method of the semiconductor device of the invention, a forming method of the second spacer includes the following. A spacer material layer is conformally formed on the substrate. An anisotropic etching process is performed to remove a portion of the spacer material layer and keep the spacer material layer located on the sidewalls of the first spacer, the top surface of the first gate, and the sidewalls of the second gate.

In an embodiment of the manufacturing method of a semiconductor device of the invention, a silicide layer is further formed on the top surface of the second gate.

In an embodiment of the manufacturing method of the semiconductor device of the invention, a material of the first spacer is, for instance, an oxide.

In an embodiment of the manufacturing method of the semiconductor device of the invention, a material of the second spacer is, for instance, a nitride.

In an embodiment of the manufacturing method of the semiconductor device of the invention, a material of the hard mask layer is, for instance, a nitride.

In an embodiment of the manufacturing method of the semiconductor device of the invention, a ratio of a height of the hard mask layer to a width of the first gate is, for instance, greater than 2.

Based on the above, in the invention, the top surface of the first gate is covered by the first spacer and a silicide layer is not formed thereon, and therefore the first gate can be ensured to have a higher resistance value meeting demand. Moreover, since the first spacers formed above the first gates and located on the sidewalls of opposite second spacers are merged together in the forming process and can cover the top surface of the first gate, the object of protecting the top surface of the first gate can be achieved without performing an additional process.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
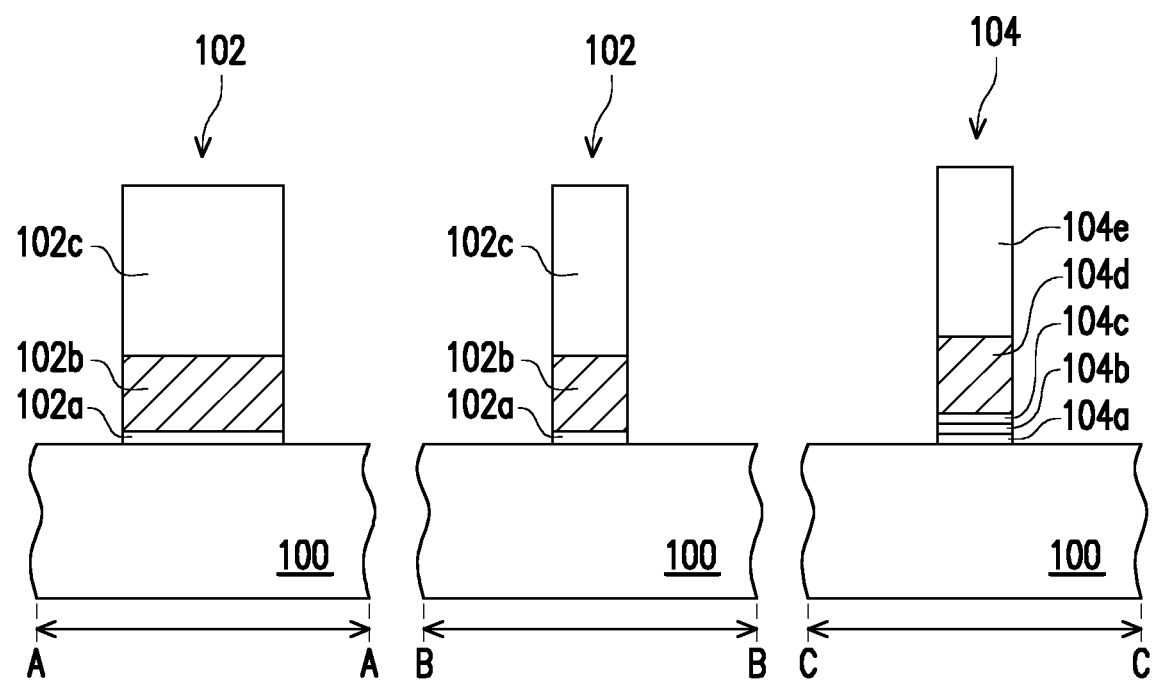
FIG. 1A to FIG. 1D are cross sections of the manufacturing process of a semiconductor device shown according to an embodiment of the invention.

In the following, the embodiments of the invention are described with reference to figures. In the figures, for clarity, the shape, size, and ratio, etc. of each element may be enlarged or shrunk.

FIG. 1A to FIG. 1D are cross sections of the manufacturing process of a semiconductor device shown according to an embodiment of the invention. FIG. 2 is a top view of the structure of FIG. 1A. First, referring to both FIG. 1A and FIG. 2, a substrate 100 is provided. The substrate 100 is, for instance, a silicon substrate. In the present embodiment, the substrate 100 has a peripheral region 100a and a memory region 100b. The peripheral region 100a can be used to form, for instance, a logic device, a resistor device, or a capacitor device. The memory region 100b is used to form various memory devices. Next, a gate structure 102 is formed on the substrate 100 of the peripheral region 100a, and a gate structure 104 is formed on the substrate 100 of the memory region 100b. Further description is provided below.

Referring to FIG. 2, in the present embodiment, the width of the end portions of the gate structure 102 is greater than the width of the middle portion and the gate structure 102 forms an "I" shape, and the width of the end portions of the gate structure 104 is substantially the same as the width of the middle portion and the gate structure 104 is a strip. It is obvious from the cross sections along section line A-A and section line B-B that, the width of the end portions of the gate structure 102 is significantly greater than the width of the middle portion to facilitate the forming of a contact via connected to the gate structure 102 in a subsequent process.

In the present embodiment, the forming method of the gate structure 102 and the gate structure 104 includes, for instance, the following steps. First, a gate dielectric material layer (such as an oxide layer) is formed on the substrate 100. Next, the gate dielectric material layer in the memory region 100b is removed. Next, a mask layer is formed on the gate dielectric material layer in the peripheral region 100a. Next, a first oxide layer, a nitride layer, and a second oxide layer are formed on the substrate 100 in the memory region 100b in order, i.e., the generally-known ONO stacked structure. Next, the mask layer is removed, and a gate material layer and a hard mask material layer are formed on the substrate 100 in order. Next, a patterning process is performed to remove a portion of the dielectric material layer, a portion of the gate material layer, and a portion of the hard mask material layer to form the gate structure 102 including a gate dielectric layer 102a, a gate 102b, and a hard mask layer 102c on the substrate of the peripheral region 100a and form the gate structure 104 including a tunneling dielectric layer 104a, a charge storage layer 104b, a charge blocking layer 104c, a control gate 104d, and a hard mask layer 104e on the substrate 100 of the memory region 100b. Alternatively, in other embodiments, the ONO stacked structure in the memory region 100b can also be formed first, and then the gate dielectric material layer in the peripheral region 100a is formed.

It should be mentioned that, to facilitate a subsequent process, the middle portion of the gate structure 104 is formed such that the ratio of the height of the hard mask layer 102c to the width of the gate 102b is greater than 2. For instance, the ratio above can be achieved by controlling the thickness of the hard mask material layer formed or controlling the width of the gate 102b formed in the patterning process. Further description is provided below.

Figure 1B:
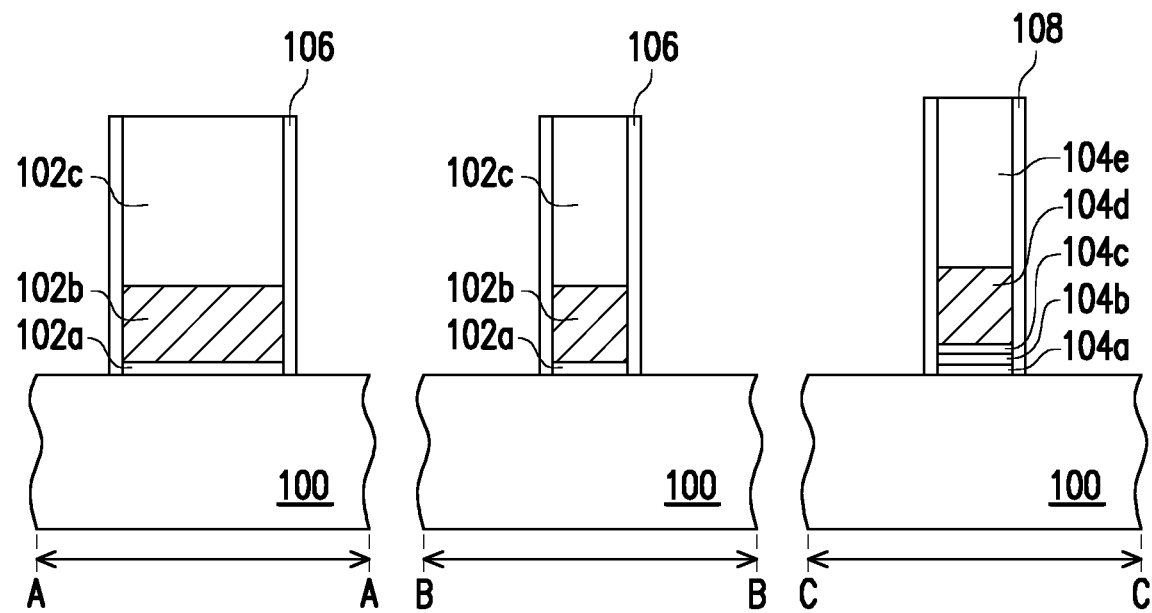
Figure 2:
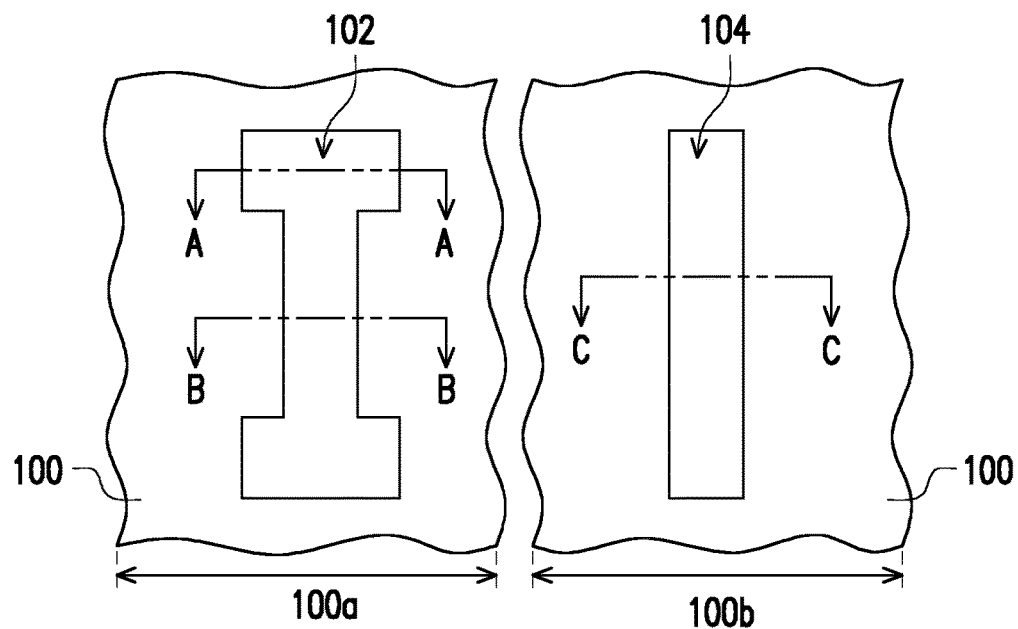
FIG. 2 is a top view of the structure of FIG. 1A.

Next, referring to FIG. 1B, a spacer 106 is formed on the sidewalls of the gate structure 102, and a spacer 108 is formed on the sidewalls of the gate structure 104. In the present embodiment, the material of the spacer 106 and the spacer 108 is, for instance, an oxide. In other embodiments, the spacer 106 and the spacer 108 can also have a composite structure formed by an oxide layer and a nitride layer. In the present embodiment, the forming method of the spacer 106 and the spacer 108 includes the following steps. First, a spacer material layer is conformally formed on the substrate 100. Next, an anisotropic etching process is performed to remove a portion of the spacer material layer and keep the spacer material layer located on the sidewalls of the gate structure 102 and the gate structure 104 and expose the top surfaces of the gate structure 102 and the gate structure 104 (i.e., the top surfaces of the hard mask layer 102c and the hard mask layer 104e).

Figure 1C:
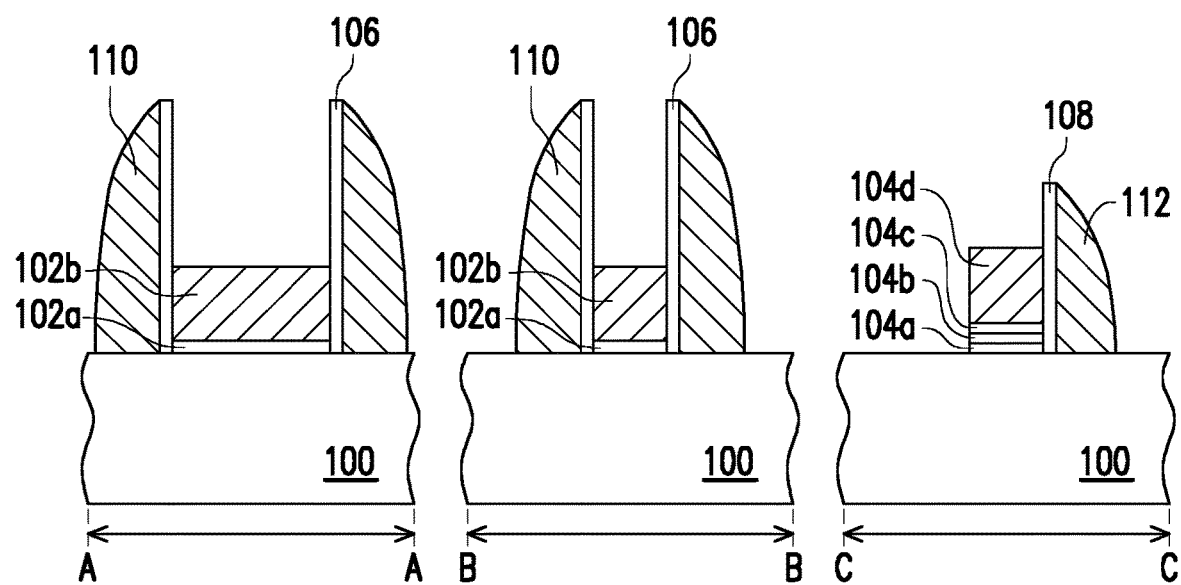

Next, referring to FIG. 1C, a gate 110 is respectively formed on the spacer 106 at two sides of the gate structure 102, and a gate 112 is formed on the spacer 108 at a side of the gate structure 104. In the memory region 100b, the gate 112 can be used as a select gate. The forming method of the gate 110 and the gate 112 includes the following steps. First, a gate material layer (such as a metal layer or a polysilicon layer) is conformally formed on the substrate 100. Next, an anisotropic etching process is performed to remove a portion of the gate material layer and keep the gate material layer located on the sidewalls of the gate structure 102 and the gate structure 104 and expose the top surfaces of the gate structure 102 and the gate structure 104 (i.e., the top surfaces of the hard mask layer 102c and the hard mask layer 104e). In the present embodiment, after the anisotropic etching process is performed, the top surface of the gate 110 is higher than the top surface of the gate 102b and substantially coplanar with the top surface of the spacer 106.

Next, the hard mask layer 102c and the hard mask layer 104e are removed. The method of removing the hard mask layer 102c and the hard mask layer 104e includes, for instance, performing an etching process by using phosphoric acid as the etchant. In the present embodiment, since the ratio of the height of the hard mask layer 102c to the width of the gate 102b is greater than 2, after the hard mask layer 102c is removed, the aspect ratio of the space formed above the gate 102b and located between the opposite spacers 106 is greater than 2.

Moreover, in the present embodiment, the height of the gate 112 located in the memory region 100b is less than the height of the gate 110 located in the peripheral region 100a, and the gate 112 in the memory region 100b is only formed at a side of the gate structure 104. Therefore, a mask layer can be formed on the substrate 100 of the peripheral region 100a at the right time to cover the elements on the substrate 100, and then an etching process is performed on the spacer 108 and the gate 112 in the memory region 100b to form the desired structure. The process steps above are known to those skilled in the art and are not described herein. In another embodiment, the height of the gate 112 in the memory region 100b can be the same as the height of the gate 110 located in the peripheral region 100a, and therefore only the spacer 108 and the gate 112 at a side of the gate structure 104 need to be removed without adjusting the height of the spacer 108 and the gate 112 at the other side.

Figure 1D:
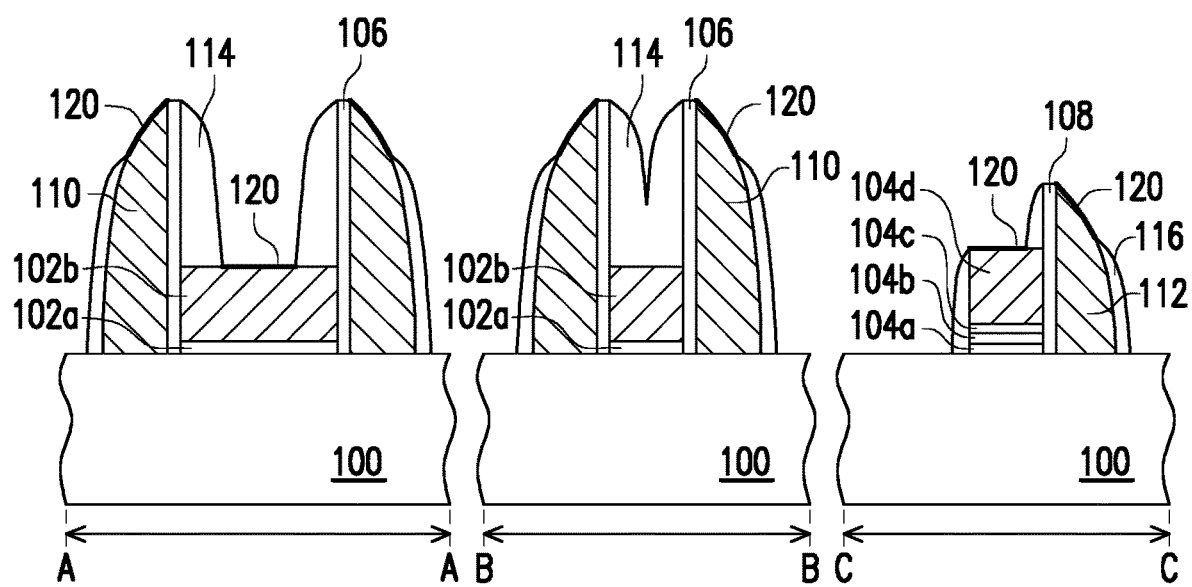

Next, referring to FIG. 1D, a spacer 114 is formed on the sidewall of the spacer 106 protruding from the top surface of the gate 102b and on the sidewalls of the gate 110, and a spacer 116 is formed on the sidewall of the spacer 108 protruding from the top surface of the gate 104d and on the sidewalls of the gate 112. In the present embodiment, the forming method of the spacer 114 and the spacer 116 includes the following steps. First, a spacer material layer is conformally formed on the substrate 100. Next, an anisotropic etching process is performed to remove a portion of the spacer material layer and keep the spacer material layer located on the sidewalls of the spacer 106, the gate 110, the spacer 108, and the gate 112 and expose a portion of the top surface of the gate 102b, the top surface of the gate 110, a portion of the top surface of the gate 104d, and the top surface of the gate 112.

In the present embodiment, in the middle portion of the gate structure 102 (refer to the cross section along section line B-B), since the aspect ratio of the space above the gate 102b and located between opposite spacers 106 is greater (such as greater than 2), the spacers 114 formed on the opposite spacers 106 are merged together to cover the top surface of the gate 102b. Moreover, at the end portion of the gate structure 102 (refer to the cross section along section line A-A), since the gate 102b has a greater width such that the aspect ratio of the space above the gate 102b and located between the opposite spacers 106 is smaller (such as less than or equal to 2), the spacers 114 formed on the opposite spacers 106 are not merged together and expose a portion of the top surface of the gate 102b.

Next, a silicide process is performed to form a silicide layer 120 on the top surface of the exposed gate 102b, the top surface of the exposed gate 110, the top surface of the exposed gate 104d, and the top surface of the exposed gate 112. Since the top of the gate 102b in the middle portion of the gate structure 102 is covered by the spacers 114 (shown in the cross section along section line B-B), in the silicide process, the silicide layer 120 is not formed on the top surface of the gate 102b in the middle portion of the gate structure 102.

In the present embodiment, the silicide layer 120 is formed on a portion of the top surface of the gate 102b at the end portion of the gate structure 102 and a portion of the top surface of the gate 104d, and therefore when a contact via connected thereto is subsequently formed, the contact via can be connected to the silicide layer 120 such that the device has better electrical performance. Moreover, since the top surface of the gate 102b in the middle portion of the gate structure 102 is covered by the spacer 114 and the silicide layer 120 is not formed, the gate 102b in this portion can be ensured to have a higher resistance value meeting demand.

Moreover, in the present embodiment, by making the aspect ratio of the space above the gate 102b in the middle portion of the gate structure 102 and located between the opposite spacers 106 greater (such as greater than 2), the spacers 114 are merged in this space in the forming process and cover the top surface of the gate 102b, and therefore the object of protecting the top surface of the gate 102b can be achieved without performing an additional process. This process can be integrated with a regular memory process, that is, the current process steps do not need to be adjusted to achieve the object above.

Figure 3:
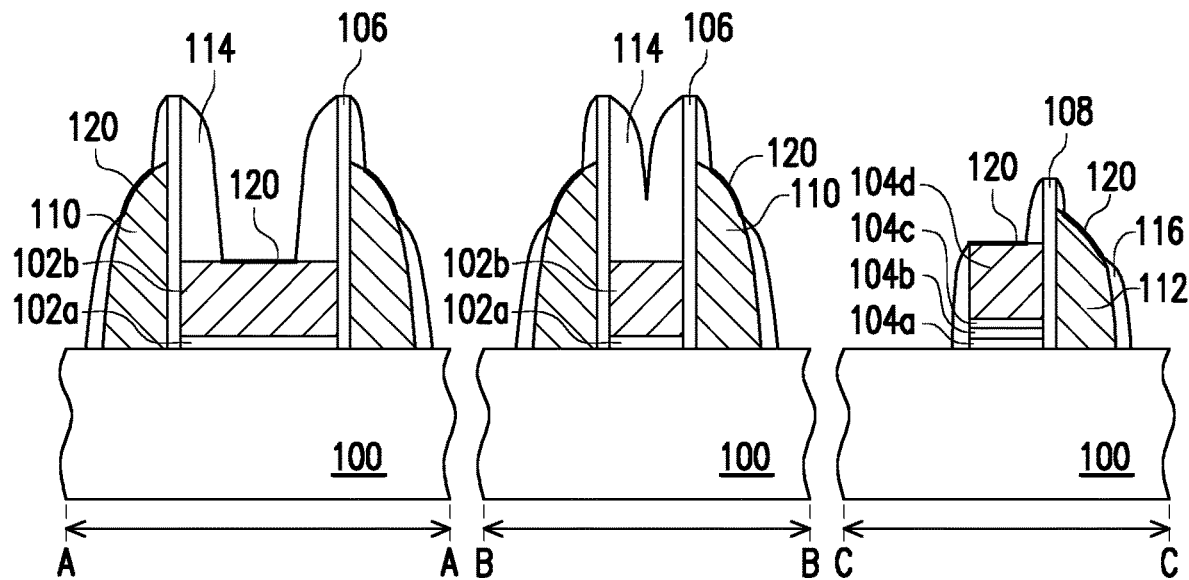
FIG. 3 is a cross section of a semiconductor device according to another embodiment of the invention.

In the present embodiment, the top surface of the gate 110 is higher than the top surface of the gate 102b and is substantially coplanar with the top surface of the spacer 106, but the invention is not limited thereto. In other embodiments, when the gate 110 is formed, the top surface of the gate 110 can be made lower than the top surface of the spacer 106 but still higher than the top surface of the gate 102b as needed. Therefore, when the spacer 114 is formed, the spacer 114 is also formed on the sidewall of the spacer 106 away from the gate 102b, as shown in FIG. 3. As a result, contact between the silicide layer 120 on the gate 110 and the silicide layer 120 on the gale 120b can be prevented to avoid the issue of a short circuit.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
a first gate disposed on a substrate;
a gate dielectric layer disposed between the first gate and the substrate;
a pair of second gates disposed on the substrate and respectively located at two sides of the first gate, wherein top surfaces of the pair of second gates are higher than a top surface of the first gate;
a first spacer disposed on sidewalls of the pair of second gates protruding from the top surface of the first gate and covering the top surface of the first gate, wherein the first spacer comprises two merged together spacers with a recess in a middle thereof; and
a second spacer disposed between the gate dielectric layer and the pair of second gates, between the first gate and the pair of second gates, and between the first spacer and the pair of second gates.

2. The semiconductor device of claim 1, further comprising a third spacer disposed on sidewalls of the pair of second gates away from the first gate.

3. The semiconductor device of claim 2, wherein a material of the third spacer and a material of the first spacer are the same.

4. The semiconductor device of claim 2, further comprising a silicide layer disposed on the top surfaces of the pair of second gates.

5. The semiconductor device of claim 4, wherein the top surfaces of the pair of second gates is lower than a top surface of the second spacer, and the semiconductor device further comprises a fourth spacer disposed on the top surfaces of the pair of second gates and located on the second spacer, and the silicide layer is located on exposed portions of the top surfaces of the pair of second gates.

6. The semiconductor device of claim 5, wherein a material of the third spacer, a material of the fourth spacer, and a material of the first spacer are the same.

7. The semiconductor device of claim 1, wherein a material of the first spacer comprises a nitride.

8. The semiconductor device of claim 1, wherein a material of the second spacer comprises an oxide.

9. The semiconductor device of claim 1, wherein a ratio of a total height of the pair of second gates protruding from the top surface of the first gate to a total width of the first gate is greater than 2.

10. A manufacturing method of a semiconductor device, comprising:
forming a gate structure on a substrate, wherein the gate structure comprises a gate dielectric layer located on the substrate, a first gate located on the gate dielectric layer, and a hard mask layer located on the first gate;
forming a first spacer on sidewalls of the gate structure;
forming a second gate on the first spacer respectively at two sides of the gate structure, wherein a top surface of the second gate is higher than a top surface of the first gate;
removing the hard mask layer; and
forming a second spacer on sidewalls of the first spacer protruding from the top surface of the first gate and on sidewalls of the second gate, wherein the second spacer covers the top surface of the first gate and wherein the second spacer comprises two merged together spacers with a recess in a middle thereof.

11. The manufacturing method of the semiconductor device of claim 10, wherein a forming method of the gate structure comprises:
forming a gate dielectric material layer, a gate material layer, and a hard mask material layer on the substrate in order; and
performing a patterning process to remove a portion of the gate dielectric material layer, a portion of the gate material layer, and a portion of the hard mask material layer.

12. The manufacturing method of the semiconductor device of claim 10, wherein a forming method of the first spacer comprises:
conformally forming a spacer material layer on the substrate; and
performing an anisotropic etching process to remove a portion of the spacer material layer and keep the spacer material layer located on the sidewalls of the gate structure.

13. The manufacturing method of the semiconductor device of claim 10, wherein a forming method of the second gate comprises:
conformally forming a gate material layer on the substrate; and
performing an anisotropic etching process to remove a portion of the gate material layer and keep the gate material layer located on the sidewalls of the gate structure.

14. The manufacturing method of the semiconductor device of claim 13, wherein after the anisotropic etching process is performed, a top surface of the gate material layer located on the sidewalls of the gate structure is lower than a top surface of the hard mask layer.

15. The manufacturing method of the semiconductor device of claim 10, wherein a forming method of the second spacer comprises:
conformally forming a spacer material layer on the substrate; and
performing an anisotropic etching process to remove a portion of the spacer material layer and keep the spacer material layer located on the sidewall of the first spacer, the top surface of the first gate, and the sidewalls of the second gate.

16. The manufacturing method of the semiconductor device of claim 10, further comprising forming a silicide layer on the top surface of the second gate.

17. The manufacturing method of the semiconductor device of claim 10, wherein a ratio of a total height of the hard mask layer to a total width of the first gate is greater than 2.

18. A semiconductor device, comprising:
a first gate disposed on a substrate;
a gate dielectric layer disposed between the first gate and the substrate;
a pair of second gates disposed on the substrate and respectively located at two sides of the first gate, wherein top surfaces of the pair of second gates are higher than a top surface of the first gate;
a first spacer disposed on sidewalls of the pair of second gates protruding from the top surface of the first gate and covering the top surface of the first gate, wherein a bottom surface of the first spacer is in direct contact with an entire topmost surface of the first gate; and
a second spacer disposed between the gate dielectric layer and the pair of second gates, between the first gate and the pair of second gates, and between the first spacer and the pair of second gates.

19. The semiconductor device of claim 18, wherein the substrate comprises a peripheral region and a memory region, the first gate is disposed in the peripheral region, and a gate structure is disposed in the memory region.

20. The semiconductor device of claim 18, wherein no silicide layer is disposed on the topmost surface of the first gate.

\* \* \* \* \*